United States Patent [19]

Christ et al.

[11] Patent Number: 4,564,880

[45] Date of Patent: Jan. 14, 1986

[54] APPARATUS AND METHOD FOR PROTECTING INTEGRATED CIRCUITS

[75] Inventors: Allen E. Christ, Scottsdale; Thomas A. Roche, Tempe, both of Ariz.

[73] Assignee: Motorola, Inc., Schaumburg, Ill.

[21] Appl. No.: 589,904

[22] Filed: Mar. 14, 1984

[51] Int. Cl.⁴ .............................................. H05F 1/02
[52] U.S. Cl. ................................... 361/212; 206/334; 361/220
[58] Field of Search ....................... 361/212, 220, 380; 339/17 CF, DIG. 2; 206/328, 45.14, 329, 334; 220/82 R, 339; D9/418, 424, 426

[56] References Cited

U.S. PATENT DOCUMENTS 4,241,829  12/1980  Hardy ................................... 206/334
4,327,832  5/1982   de Matteo ......................... 220/82 R
4,463,851  8/1984   Cecil ................................... 220/82 R
4,494,651  1/1985   Malcolm ............................. 206/334

Primary Examiner—Harry E. Moose, Jr.
Attorney, Agent, or Firm—Lowell W. Gresham

[57] ABSTRACT

An integrated circuit (IC) carrier having uniform conductivity and the ability to securely hold an IC in a predetermined position within the carrier is disclosed. The IC is securely held inside a closed enclosure without using the IC leads to support the IC. Additionally, a viewing window which allows the reading of information printed on the IC from outside the closed enclosure is disclosed. The enclosure is formed as a one-piece object which additionally includes a living hinge, a latching system, structure which aids stacking, and structure which facilitates opening of the enclosure by automated means.

18 Claims, 5 Drawing Figures

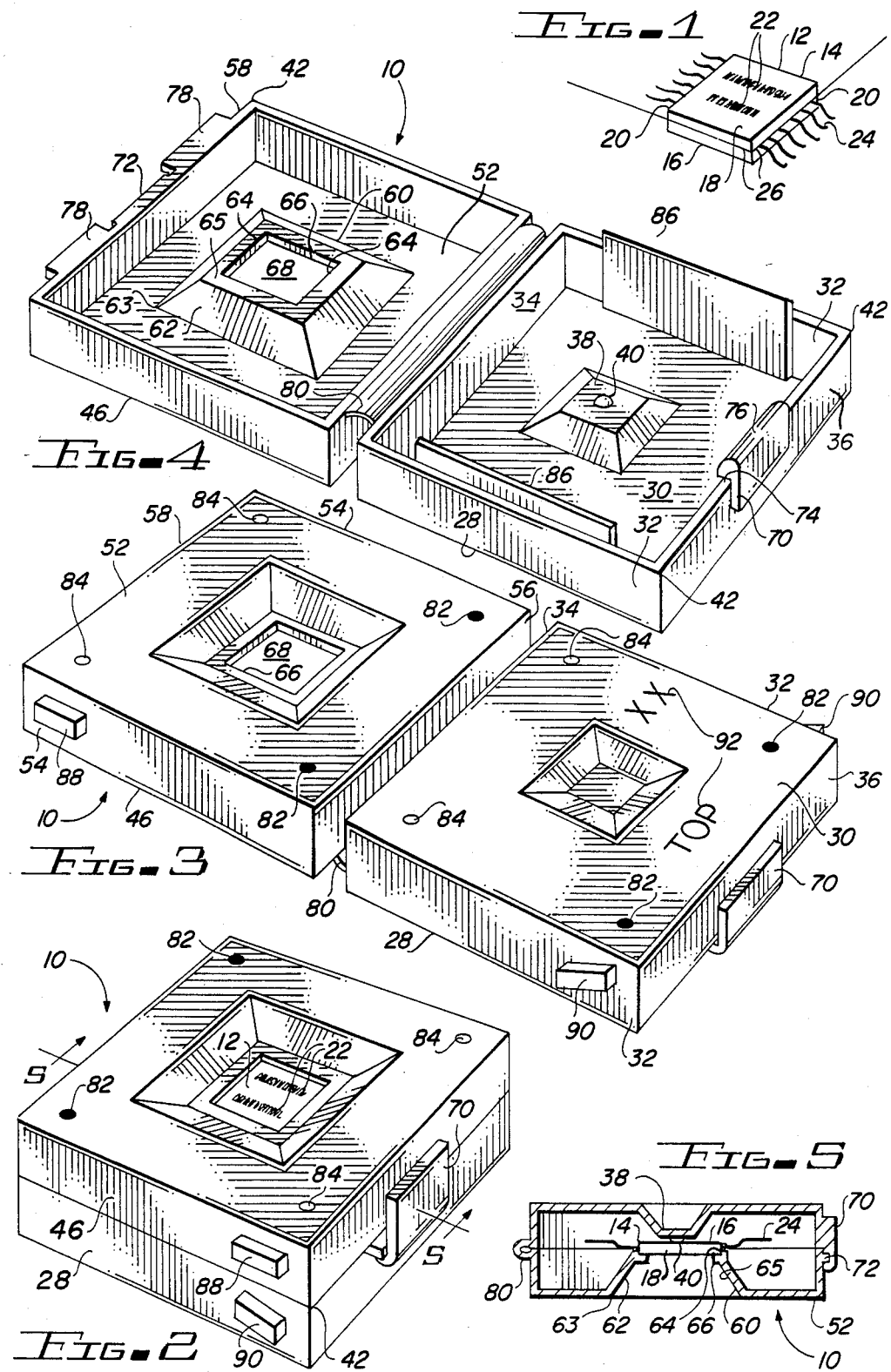

APPARATUS AND METHOD FOR PROTECTING INTEGRATED CIRCUITS

BACKGROUND OF THE INVENTION

The present invention relates generally to an apparatus and method for protecting static sensitive devices. Specifically, the present invention relates to enclosing lead formed integrated circuits within an antistatic enclosure so that the integrated circuit (IC) is sufficiently protected from static electricity, chemical contamination, and mechanical deformation.

Manufacturers of ICs and of printed wiring boards (PWBs) which utilize ICs need to provide protection while storing and transporting the ICs prior to installation in PWBs. While the prior art contains various protective schemes, these schemes typically provide inadequate protection from the various types of danger that can harm an IC. To guarantee that a properly manufactured IC will function correctly in a properly designed PWB, the IC needs protection from three types of danger: electrical, mechanical, and chemical.

A rapid discharge of static electricity in the vicinity of the IC presents the major electrical danger. As known in the prior art the use of antistatic materials lessens this danger. However, some carriers, such as those which use conductive foam, inadequately protect against static damage because the total volume surrounding the IC contains a composite of various materials, such as air and foam. The composite therefore exhibits a non-uniform conductivity in the vicinity of the IC. This non-uniform conductivity subjects the IC to excess danger from static originating from various directions and from rapid discharge sections within the carrier itself. Other carriers, such as those made from metals, provide inadequate static protection because they conduct too well, and tend to rapidly discharge.

Additionally, various carriers provide inadequate static protection because they promote excess handling of the IC. The excess handling presents one static danger from the handling itself and another static danger from an increased likelihood that the IC will be removed from its protective carrier where it will then be exposed to static. Such excess handling dangers characterize carriers in which many parts are collectively housed in one carrier so that unneeded parts are handled when a needed part is used. Excess handling also occurs in carriers where the carrier must be opened or the IC removed in order to read any writing printed on the IC.

Impacts and lead bending represent the major mechanical dangers. A typical IC package has a multiplicity of conductive leads attached to a rigid body. The IC chip itself is housed within the body and electrically connected to the conductive leads by very small wires within the body. An impact can harm the IC body by destroying an internal connection or causing a part of the body itself to break off thereby destroying a seal and exposing the internal IC chip to possible contamination. Prior art carriers inadequately protect against impact if they require excess handling of the IC. Excess handling increases the likelihood of dropping, which subjects the IC to an endangering impact when the IC crashes into a hard surface, such as a floor. Prior art carriers which collectively house many ICs in one carrier also pose an impact danger. If the IC is not securely retained in a predetermined position within the carrier, normal handling of the carrier can produce an endangering impact through ICs crashing into each other.

The degree of danger posed from lead bending depends on the type of package used. Various types of packages are known in the art. A Dual-Inline-Package (DIP) represents one commonly used package type. DIP leads form two lines, where each lead has an approximately perpendicular bend so that the leads extend below the IC, perpendicular to the bottom of the IC. Thus, DIP leads insert into corresponding sockets or through corresponding holes in PWBs, which are also perpendicular to the bottom of an installed DIP. Flat packs represent a less commonly used package type. Flat pack leads extend beyond the IC in a plane slightly below and parallel to the bottom of the IC. Thus, flat pack leads solder directly to PWB traces, which are correspondingly located in a plane slightly below and parallel to the bottom of an installed flat pack.

A lead bending danger from breaking the connection between a lead and a small wire internal to the IC body or breaking the seal of the body around the lead exists for DIPs. Prior art carriers that support an IC within the carrier by the leads inadequately protect against this danger. One such carrier supports the IC within a four-wall open container through spring action of the leads against the internal walls of the carrier. The supporting of the IC by its leads tends to stress the junction of the lead and the IC body. Normal handling of a carrier occasionally causes impacts through bumping or dropping. When the lead-to-body junction is stressed any such impact can magnify that stress enough to endanger the internal electrical connection or seal.

This lead bending danger occurs not only through the initial stresses placed on the lead-body junction from the initial bending, but also during the later repair of a bent lead. Furthermore, a static danger occurs through the excess handling required to repair the bend. The prior art carriers which promote excess handling of the IC inadequately protect against lead bends. Excess handling increases the likelihood of the IC being in a situation where lead bends are likely to occur.

The DIP lead bending dangers pose only a portion of the lead bending threats faced by flat packs. Displacing flat pack leads from the position in which they were originally manufactured exposes flat packs to a later possible bad connection. A mere slight horizontal or vertical variation away from a lead's formed position endangers the quality of a solder connection between the lead and a corresponding PWB trace. Thus, any object that contacts a flat pack's leads risks displacing those leads from their formed position. The prior art carriers which place unneeded pressure on flat pack leads, allow flat packs to move within the carrier, contact other ICs, contact the carrier itself, or promote excess handling of the IC inadequately protect flat pack leads from this lead-bending danger.

Contamination of the leads poses a major chemical danger to ICs. Chemical reactions between an IC lead and materials in the IC's environment endanger the electrical connection between that lead and PWB sockets, solder joints, or traces. Prior art carriers which allow the IC leads to directly contact conductive foam risk a possible contaminating chemical reaction between the foam and leads. Other prior art carriers which tightly clamp the IC leads to the carrier risk a possible contaminating oxidation reaction by entrapping moisture between the leads and carrier.

SUMMARY OF THE INVENTION

The present invention relates to a carrier for static sensitive devices, such as integrated circuits (ICs). It defines an enclosure constructed to have top and bottom sections electrically connected together, and a latching structure for preventing the top and bottom sections from separating once the enclosure is closed. Structure inside the enclosure contacts and securely holds the static sensitive device between the top and bottom sections when the enclosure closes.

One object of the present invention concerns providing an adequate amount of static protection for the IC housed within the enclosure. To accomplish the static protection the enclosure is constructed from antistatic materials. Furthermore, the antistatic materials provide a volume of substantially uniform conductivity around the enclosed IC so that static discharges originating from any direction tend to be harmless, and so that no rapid discharge portions of the carrier are formed.

Another object of the present invention relates to displaying information printed on the IC outside the enclosure. The displaying function allows the observing of such information without handling the IC. Unnecessary handling endangers the IC through the possibility of static discharge, dropping the IC, or bending the IC leads. One specific embodiment of the present invention therefore includes an opening in the enclosure through which the information printed on the IC can be directly observed from outside the closed enclosure. In this embodiment any loss in static protection caused by the opening is compensated for by positioning the IC well within the interior of the enclosure.

Still another object concerns securely holding the IC in a predefined position within the enclosure so that the IC cannot move around inside the carrier. This protects the IC from possible lead damage caused by the IC crashing into interior walls of the enclosure.

Yet another object relates to holding the IC by its rigid body only so that the leads do not support the IC. Freely suspending the leads within the enclosure gives the leads the protection of the surrounding enclosure walls. It further protects the leads from unnecessary stresses and contamination. Additionally, it aids in protecting the IC from static discharge by isolating the leads from objects which are likely to source a static discharge.

An additional object of the present invention gives the enclosure the ability to receive and retain the IC in its predetermined position until the enclosure closes. This ability insures that the IC easily loads into the enclosure. Therefore, it protects the IC from the unnecessary handling required of more difficult to load carriers and from the dangers this handling can cause.

A further object allows manufacturing the enclosure at a very low cost. Thus, housing only a single part in each enclosure is cost effective. As a result excess handling of the IC decreases from the handling necessitated with collective housing schemes because the enclosure need not be disturbed or opened unless the particular enclosed IC is needed.

Still another object relates to constructing the carrier from a generally rigid material to protect the IC leads enclosed within the carrier from external forces. However, at the same time the material from which the carrier is constructed is slightly flexible so that the carrier absorbs a portion of external impacts instead of transmitting them to the enclosed IC.

Another object relates to sizing the carrier large enough to provide the internal IC sufficient protection of the surrounding walls from external forces, yet sizing the carrier small enough to provide a favorable packing density when several of the carriers are packed together.

Yet another object concerns providing structure for aiding the stacking of several of the carriers so that the carriers can be easily stacked, and so that such a stack of carriers is stable.

Other important features of this invention will become apparent from a study of the following specification, claims, and the attached drawings.

BRIEF DESCRIPTION OF THE DRAWINGS

FIG. 1 illustrates a typical "flat pack" integrated circuit (IC) package, which the present invention can be adapted to protect.

FIG. 2 shows the closed mode of a carrier according to the present invention with the carrier containing the IC from FIG. 1.

FIG. 3 shows an open mode, outside view of a carrier according to the present invention.

FIG. 4 shows an open mode, inside view of a carrier according to the present invention.

FIG. 5 shows a sectional view on line 5—5 of FIG. 2.

DETAILED DESCRIPTION OF THE INVENTION

FIG. 1 illustrates a typical "flat pack", which is one type of integrated circuit (IC) package that the carrier 10 (see FIG. 2) of the present invention protects. However, this invention is nowise limited to use with only flat pack type IC packages. For instance, the present invention adapts equally well to dual-inline IC packages, quad-inline IC packages, circularly shaped IC packages, other IC package types, and other fragile, static sensitive devices.

A device that the present invention protects typically exhibits characteristics similar to those of the IC 12. IC 12 contains a rigid body 14. Moderate external forces applied to body 14 tend not to harm IC 12 because body 14 possesses the material property of rigidity. In this embodiment body 14 forms a short square box approximately 0.5 inch by 0.5 inch by 0.1 inch having a square shaped IC top 18 parallel to a square shaped IC bottom 16. IC top 18 and IC bottom 16 are spaced apart by adjoining IC sides 20. Additionally, IC top 18 displays information 22. This information typically identifies the manufacturer, part number, and date code of IC 12. Of course it will be understood that the terms "top" and "bottom" are relative terms and suggest no particular orientation relative to the direction of gravitational forces.

IC 12 additionally contains a multiplicity of flexible conductive leads 24 which engage body 14 along IC sides 20 at lead-body junction plane 26. However unlike body 14, external forces applied to leads 24 endanger IC 12. Leads 24 are preformed into a predetermined position relative to body 14. Since the material property of flexibility characterizes leads 24, external forces subject leads 24 to a possible deformation which alters their preformed position. Furthermore, stresses applied to leads 24 tend to harm IC 12 in the immediate area of lead-body junction plane 26. In this embodiment flat pack leads 24 are formed so that the overall IC dimensions are approximately 0.8 inch by 0.5 inch by 0.15 inch. As is typical with flat packs, leads 24 are formed coplanar to each other within 0.005 inch in a plane parallel to IC top 18 and IC bottom 16.

Carrier 10 of the present invention provides an enclosure for the housing of IC 12, as shown in FIG. 2. Carrier 10 protects IC 12 from rapid discharges of static electricity. Constructing carrier 10 from antistatic materials aids in this protection. Such materials tend to be moderately conductive. A moderate conductivity allows static buildups to discharge slowly so as not to endanger enclosed IC 12.

The specific embodiment of carrier 10 shown in FIGS. 2–5 discloses a carrier 10 constructed from an antistatic plastic material, such as various RCAS resins manufactured by the Richmond Division of Dixico, Inc. Such a plastic contains a detergent which absorbs moisture from the atmosphere. This moisture causes carrier 10 to demonstrate sufficient conductivity. Furthermore, such a plastic material permits a relatively low cost manufacturing of carrier 10 by the injection molding process.

The injection molding process also allows forming all parts of carrier 10 together as integral portions of a one-piece object. The one-piece object characteristic of this embodiment tends to insure uniform conductivity throughout carrier 10. And, uniform conductivity minimizes any tendency of a local section of carrier 10 to exhibit a substantially higher static discharge rate than other sections of carrier 10.

Another property resulting from the use of a plastic concerns the mechanical characteristics of plastics. Carrier 10 protects IC 12 from mechanical dangers, such as impacts and objects which tend to deform or stress leads 24. The plastic used in this embodiment tends to be flexible enough to absorb a portion of impacts rather than to transmit the total force of such impacts to an enclosed IC 12. On the other hand, the plastic tends to remain rigid enough to retain its shape sufficiently to protect an enclosed IC 12 from external objects.

The size of carrier 10 balances competing design considerations. Enclosing as large a volume as possible within carrier 10 aids in protecting IC 12 from mechanical dangers. Thus, carrier 10 accommodates an enclosed IC 12 and additionally provides unused space so that the surrounding enclosure provides leads 24 of IC 12 adequate protection. The contrary consideration concerns sizing carrier 10 as small as possible to maximize the packing density between several of carriers 10 and to minimize the quantity of material required for each carrier 10. In this embodiment, carrier 10 is an approximately 1.2 inch by 1.2 inch by 0.3 inch OD box-shaped enclosure having walls approximately 0.050 inch thick. The FIG. 5 sectional view of carrier 10 shows the relative size of IC 12 to carrier 10 and the unused space.

The basic components of the enclosure of carrier 10 includes a top section 28, a bottom section 46, a hinge 80, a latching system, which includes latch hook 70, a stacking system, which includes positioning bumps 82 and cavities 84, and an automated opening system, which includes holding blocks 88 and angle blocks 90, as shown in FIG. 2. This embodimemnt of the present invention provides an opening through bottom section 46 for displaying the enclosed IC 12 and the information 22 printed thereon.

Top section 28 contains a generally flat, square ceiling 30 having four sides, as shown in FIG. 3. Top section transverse walls 32 perpendicularly attach to two opposing sides of ceiling 30 so that transverse walls 32 are parallel to each other and extend toward the interior of carrier 10. Top section hinge wall 34 and top section latch wall 36 perpendicularly attach to the other two sides of ceiling 30 and extend toward the interior of carrier 10. Additionally, top section hinge wall 34 perpendicularly attaches to one of transverse walls 32, which perpendicularly attaches to top section latch wall 36, which perpendicularly attaches to the other of transverse walls 32, which perpendicularly attaches to top section hinge wall 34. The resulting shape of top section 28 resembles a short, square box opened on one of the square sides.

The interior of top section 28 contains a holding pedestal 38 centrally located on ceiling 30, as shown in FIG. 4. When carrier 10 contains IC 12 and is in the closed mode, holding pedestal 38 contains IC bottom 16 of IC body 14, as shown in FIG. 5. Holding pedestal 38 attaches on one end to the interior side of ceiling 30 and projects toward the interior of carrier 10. Holding pedestal 38 contains a holding pedestal tip 40 located on its interior end. Tip 40 is the portion of holding pedestal 38 which contacts IC 12 when carrier 10 closes, as shown in FIG. 5. Tip 40 forms a hemispherical dome with the circular part thereof facing the interior of carrier 10. Tip 40 eases manufacturing by being relatively easy to redimension. Thus, carrier 10 accomodates a thinner IC body 14 merely by increasing the diameter of tip 40, or a thicker IC body 14 by decreasing the diameter of tip 40. Note that the accommodation of different package sizes may require an additional alteration of various bottom section 46 features.

The interior of top section 28 also includes an alignment rail 86 along the interior side of each of transverse walls 32, as shown in FIG. 4. Alignment rails 86 aid the closing of carrier 10 by insuring that top section 28 and bottom section 46 are properly positioned relative to each other. Rails 86 project beyond transverse walls 32 at parting line 42 toward the interior of carrier 10. Parting line 42 represents the plane between top section 28 and bottom section 46 when carrier 10 is in the closed mode, as shown in FIGS. 2 and 4. When carrier 10 closes, a portion of alignment rails 86 extends into the interior of bottom section 46. Accordingly, alignment rails 86 are tapered from the exterior or transverse wall 32 side of rail 86 at parting line 42 toward the interior, bottom section side of the rail 86.

Additionally, alignment rails 86 prevent thin objects from entering the interior of closed carrier 10. Thus, rails 86 block the majority, approximately 70% in this specific embodiment, of parting line 42 between top section 28 and bottom section 46 of closed carrier 10 along transverse walls 32.

This embodiment further contains information 92 formed on the exterior side of top section 28, as shown in FIG. 3. Information 92 denotes the top of carrier 10, types of packages accommodated by carrier 10, or any other information suitable to a particular application. Of course, it will be understood that various information could be located at any appropriate place on carrier 10.

Bottom section 46 contains a generally flat, square floor 52 having four sides, as shown in FIG. 3. Bottom section transverse walls 54 perpendicularly attach to two opposing sides of floor 52 so that transverse walls 54 are parallel to each other and extend toward the interior of carrier 10. Bottom section hinge wall 56 and bottom section latch wall 58 perpendicularly attach to the other two sides of floor 52 and extend toward the interior of carrier 10. Additionally, bottom section hinge wall 56, perpendicularly attaches to one of transverse walls 54, which perpendicularly attaches to bottom section latch wall 58, which perpendicularly attaches to the other of transverse walls 54, which perpendicularly attaches to bottom section hinge wall 56.

The OD size of bottom section 46 approximates the OD size of top section 28. Additionally, like top section 28, the resulting shape of bottom section 46 resembles a short, square box opened on one of the square sides. When carrier 10 is in the closed mode, the open square side of top section 28 opposes the open square side of bottom section 46 at parting line 42, as shown in FIG. 2.

The interior of bottom section 46 contains an IC retainer 60, as shown in FIGS. 4 and 5. Retainer 60 cooperates with holding pedestal 38 to securely hold IC 12 in a predetermined position within carrier 10 when carrier 10 is in the closed mode. Retainer 60 contains a supporting lip 66 which is offset toward the interior of carrier 10 from floor 52. When closed carrier 20 contains IC 12, IC body top 18 abuts supporting lip 66 while IC body bottom 16 abuts holding pedestal 38. Thus, body 14 of IC 12 is clamped in place between holding pedestal 38 and supporting lip 66 through the spring action produced by the resilience of the material from which carrier 10 is constructed. The support of IC 12 within carrier 10 occurs at IC body 14. IC leads 24 are isolated from contact with carrier 10 and therefore do not support IC 12.

In addition to supporting lip 66, retainer 60 contains retaining pedestal 62 attached to the central interior area of floor 52 at retaining pedestal base 63 and projecting toward the interior of carrier 10. Retaining pedestal platform 65 denotes the interior end of retaining pedestal 62. The central area of retaining pedestal platform 65 contains a section which is offset within retaining pedestal 62 toward floor 52. The depth of the offset is defined by the width of anchoring wall 64, one side of which is perpendicularly attached to platform 65.

Additionally referring to FIG. 1, the width of anchoring wall 64 is less than the distance between IC lead-body junction plane 26 and IC body top 18. Further, the shape of anchor wall 64 corresponds to the shape of IC body 14. In this embodiment IC body 14 has a square shape. Accordingly, anchoring wall 64 has a slightly larger square shape, as shown in FIG. 4. The other side of anchoring wall 64 perpendicularly attaches to supporting lip 66 so that supporting lip 66 is recessed within retaining pedestal 62, parallel to floor 52. Thus, IC body 14 is retained within the volume circumscribed by anchoring wall 64 and supporting lip 66. Additionally, the width of anchoring wall 64 between platform 65 and supporting lip 66 insures that IC leads 24 remain free from contact with carrier 10.

The retaining pedestal 62, anchoring wall 64, and supporting lip 66 structure positions IC 12 away from floor 52 toward the interior of closed carrier 10, as shown in FIG. 5. It further provides a shallow recessed area which corresponds in shape to IC body 14 and mates with IC body 14. Anchoring wall 64 securely holds IC 12 in place by preventing displacement toward transverse walls 32 and 54, and hinge and latch walls 34, 36, 56, and 58. Further, supporting lip 66 in conjunction with holding pedestal 38 securely holds IC 12 in place by preventing displacement toward ceiling 30 and floor 52. A securely held IC 12 in a predetermined position within carrier 10 is thus provided without relying on support of IC 12 by IC leads 24.

This embodiment provides a viewing window 68 for displaying information 22 printed in IC 12, as shown in FIGS. 3 and 4. Viewing window 68 consists of an opening through supporting lip 66 in bottom section 46. Supporting lip 66 contains enough material to adequately contact and support IC 12. However, viewing window 68 calls for the removal of a substantial amount of material so that supporting lip 66 does not obstruct the displaying of information 22. This specific embodiment provides an approximate 0.08 inch supporting lip in a carrier 10 which accommodates a 0.5 inch by 0.5 inch square IC 12. Those skilled in the art will recognize that the present invention is not limited to a viewing window 68 which consists of a mere opening in supporting lip 66. For example, the use of transparent or slightly translucent materials also provides viewing window 68 by allowing the observing of information 22 from outside carrier 10.

Top section 28 and bottom section 46 are maintained in an operative relationship by a mutual connection which provides the protection from static electrical build-up between sections. In this embodiment top section 28 cooperates with bottom section 46 through a hinge 80, as denoted in FIGS. 2–4. Hinge 80 attaches to both top section hinge wall 34 and bottom section hinge wall 56. Thus, hinge 80 permits top section 28 and bottom section 46 to rotate relative to each other, around the common edge between top section hinge wall 34 and bottom section hinge wall 56 at parting line 42. On the other hand, hinge 80 restricts other relative motion between top section 18 and bottom section 46.

This specific embodiment injection molds carrier 10 from an antistatic plastic material into a one piece object. Accordingly, top section 18, bottom section 46, and hinge 80 are distinct integral portions of this one piece object. A flexible, thin, approximately 0.020 inch, single strip of plastic material attached to the central section of hinge walls 34 and 56 form the hinge 80 portion. Hinge 80 attaches along approximately 80% of the length of hinge walls 34 and 56 between transverse walls 32. The electrical connection established between top section 28 and bottom section 46 sufficiently insures uniform conductivity throughout carrier 10 because carrier 10 is formed as a one piece object and because sections 28 and 46 contact each other through hinge 80 along approximately 80% of hinge walls 34 and 56.

A plastic hinge must be thin enough to allow the flexing required for a typical hinge's action. On the other hand, mere thin strips of plastic tend to fatigue with repeated flexing. This specific embodiment balances these conflicting considerations by forming hinge 80 as a living hinge. The flexible, thin, single strip of plastic that forms a living hinge tends to resist fatiguing better than a mere thin strip of plastic. Aligning the plastic molecules which comprise the molding material transverse to the flexing portion of a hinge causes the hinge to be a living hinge. In this embodiment the mold cavity used in the injection molding process molds carrier 10 in the open mode. The living hinge forms by injecting the molding material into the mold cavity from either the top section latch wall 36 or bottom section latch wall 58 ends of the open mode carrier 10.

While in this specific embodiment a hinge is used to connect the top and bottom sections it will be understood by those skilled in the art that other devices or systems might be utilized. As a typical example, a longer piece of plastic might be formed integrally with the top and bottom sections to maintain the two sections together and electrically neutral, but not to operate as a hinge per se. Alternatively, hinges and plastic strips might be completeely omitted in a system wherein top section 28 has a sufficient frictional contact with bottom section 46 to insure the needed electrical connection.

The latching system of the present invention prevents a closed carrier 10 from opening before such opening is desired, yet permits opening when desired. In one specific embodiment of the present invention the latching system includes a latch hook 70 attached to the central exterior area of top section latch wall 36, as shown in FIGS. 4 and 5. Latch hook 70 extends beyond parting line 42. A latch hook notch 74 portion of latch hook 70 exists on the interior side, immediately adjacent to parting line 42 on the extension of latch hook 70 beyond parting line 42. Additionally, a latch hook deflector 76 exists as an integral part of the extension end of latch hook 70. The shape of the extension end of latch hook 70, which tapers toward holding pedestal 38 from the exterior of the extension end, defines deflector 76.

Latching bar 72, and latch blocks 78 each attach to the exterior side of bottom section latch wall 58 at parting line 42, and cooperate with latch hook 70. Latching bar 72 attaches to the central area of wall 58 and one latch block 78 attaches to wall 58 on either side of latching bar 72. Additionally, latching bar 72 mates with latch notch 74.

As carrier 10 closes, latching bar 72 first contacts latch hook deflector 76. Continued closing of carrier 10 causes latch hook 70 to deflect toward the exterior of carrier 10. Such deflecting allows carrier 10 to continue the closing process. When carrier 10 fully closes, latching bar 72 is positioned to mate with latch hook notch 74. Resilience inherent in the deflected latch hook 70 causes latch hook 70 to return to an undeflected position, toward the interior of carrier 10, where latching bar 72 engages latch hook notch 74.

The engagement of bar 72 into notch 74 denotes the closed mode for carrier 10. Carrier 10 tends to remain in this closed mode because latch hook 70 is rigid enough to remain in its undeflected position thereby entrapping latching bar 72 within latch hook notch 74. Additionally, the clamping action inherent in the holding of IC 12 in position within carrier 10 also tends to supply a slight back pressure of latching bar 72 on latch hook 70. This back pressure also tends to keep carrier 10 in the closed mode.

Latch blocks 78 aid the alignment of latch hook notch 74 with latching bar 72 during the closing process. Latch blocks 78 further aid opening of carrier 10. Carrier 10 opens by causing latch hook 70 to deflect toward the exterior of carrier 10 while simultaneously separating bottom section 46 from top section 28. Latch blocks 78 provide an area to press against while applying the needed deflection and separation forces. While a specific latching system has been described it will be apparent to those skilled in the art that many other systems might be utilized to maintain the carrier in a closed position.

One specific embodiment of the present invention provides a system which aids the stacking of a plurality of carriers 10. Such aid occurs through promoting stability of a stack of carriers 10 so that such a stack can be handled as a single unit of carriers.

In this embodiment two positioning bumps 82 are attached on the hinge wall 56 side of the exterior of floor 52, as shown in FIGS. 2 and 3. Two more positioning bumps 82 are attached on the latch wall 36 side of the exterior of ceiling 30. Likewise, two positioning cavities 84 are formed on the latch wall 58 side of the exterior of floor 52, and two additional positioning cavities 84 are formed on the hinge wall 34 side of the exterior of ceiling 30. Bumps 82 and cavities 84 are sized and positioned correspondingly so that bumps 82 and cavities 84 attached to exterior floor 52 of one carrier 10 engage cavities 84 and bumps 82 respectively formed in the exterior ceiling 30 of another carrier 10 when the carriers 10 are similarly aligned. Of course it will be understood that other structures also aid the stacking of carriers 10. For example, any like system of engaging notches, ribs, fingers, etc. could be employed to align and stabilize a stack of carriers 10.

Another feature of an embodiment of the present invention relates to a structure which allows the opening of closed carrier 10 by an automated opening apparatus (not shown). This structure includes holding blocks 88 attached to each of bottom section transverse wall 54, and angle blocks 90 attached to each of top section transverse wall 32, as shown in FIGS. 2 and 3. As carrier 10 moves through an automated opening apparatus one member (not shown) engages holding blocks 88 and prevents any movement of bottom section 46 toward top section 28. Another member (not shown) engages angle blocks 90 so that the movement of carrier 10, and therefore angle blocks 90, pries top section 28 away from bottom section 46 thereby causing carrier 10 to open. Again, the present invention encompasses alternative systems which aid in separating top section 28 from bottom section 46. Such alternative systems meet the various requirements imposed by various automated opening apparatus.

The present invention suggests a procedure for properly loading IC 12 into Carrier 10. First, carrier 10 is opened and positioned so that floor 52 is substantially perpendicular to the force exerted by gravity, and so that the interior of bottom section 46 is above floor 52. Next, IC 12 is placed in IC retainer 60 so that IC top 18 mates with the offset outlined by anchoring wall 64 and supporting lip 66. At this point in the procedure IC retainer 60 retains IC 12 in its predetermined position within carrier 10 through the downward force of gravity acting on IC 12. Finally, while maintaining the relative positions of IC 12 and bottom section 46, top section 18 rotates around hinge 80 until latching bar 72 engages latch hook notch 74. Of course it will be understood that although the relative terms top, bottom, ceiling, and floor have been used, no particular orientation relative to the force exerted by gravity is suggested other than relating to the loading of carrier 10.

The foregoing description uses various embodiments to illustrate the present invention. However, those skilled in the art will recognize that changes and modifications may be made in these embodiments without departing from the scope of the present invention.

What is claimed is:

1. A carrier having a closed mode for housing an integrated circuit having conductive leads attached to a rigid body, said carrier comprising:
   (a) an enclosure having a top section and having a bottom section;
   (b) means for electrically connecting said enclosure top and bottom sections together;
   (c) means for maintaining said enclosure top and bottom sections in the closed mode; and
   (d) means for holding the integrated circuit rigid body inside said enclosure between said top and bottom sections so that the conductive leads are unsupported by the carrier.

2. A carrier as claimed in claim 1 wherein said top section, said bottom section, and said connecting means are together formed into a one-piece object.

3. A carrier as claimed in claim 2 wherein said one-piece object is constructed from an antistatic material.

4. A carrier as claimed in claim 2 wherein said connecting means is a living hinge.

5. A carrier as claimed in claim 1 wherein the rigid body has information thereon, and wherein said carrier additionally comprises means, integral with said bottom section, for displaying the integrated circuit rigid body so that information printed thereon is observable from outside said enclosure.

6. A carrier as claimed in claim 1 wherein said holding means comprises:
   (a) A holding pedestal located within said enclosure top section; and
   (b) an integrated circuit retainer having a supporting lip, said retainer located within said enclosure bottom section so that said enclosure in the closed mode compresses the integrated circuit rigid body between said holding pedestal and said retainer supporting lip by spring action of said enclosure.

7. A carrier as claimed in claim 6 wherein:
   (a) said enclosure bottom section additionally includes a floor; and
   (b) said integrated circuit retainer additionally includes:
      (1) an integrated circuit retaining pedestal having a base and a platform, the base being attached to the interior of said floor, said retaining pedestal extending toward the interior of said enclosure and terminating in the pedestal platform, and
      (2) an integrated circuit anchoring wall having first and second edges, said anchoring wall first edge being attached to said retaining pedestal platform, said anchoring wall extending toward said floor, and said retainer supporting lip being attached to said anchoring wall second edge and being substantially parallel to said floor.

8. A carrier as claimed in claim 1 additionally comprising means, integral with the exterior of said enclosure, for aiding the stackability of the carrier by providing structure which mates with corresponding aiding means of other of said enclosures.

9. A carrier for a static sensitive device having a rigid body, said carrier comprising:
   (a) an enclosure top section having surfaces constructed from an antistatic material;
   (b) an enclosure bottom section having surfaces constructed from an antistatic material;
   (c) an enclosure hinge constructed from an antistatic material, said hinge connecting said top section to said bottom section;
   (d) means for latching said bottom section to said top section; and
   (e) means, integral with one of said top and bottom section surfaces, for holding the device rigid body between said top and bottom sections so that the rigid body contacts said top and bottom section surfaces.

10. A carrier as claimed in claim 9 wherein said top section, said bottom section, and said hinge are together formed into a one-piece object.

11. A carrier for a static sensitive device having a rigid body and conductive leads attached to the rigid body, said carrier comprising:
   (a) An enclosure top section constructed from an antistatic material;
   (b) an enclosure bottom section constructed from an antistatic material;
   (c) an enclosure hinge constructed from an antistatic material, said hinge connecting said top section to said bottom section;
   (d) means for latching said bottom section to said top section; and
   (e) means, integral with one of said top section and said bottom section, for holding the device rigid body between said top and bottom sections so that the rigid body contacts said top and bottom sections and the conductive leads are isolated from contact with the carrier.

12. A carrier as claimed in claim 11 wherein the carrier has a closed mode and wherein said holding means comprises:
   (a) a holding pedestal located within said enclosure top section; and
   (b) an integrated circuit retainer having a supporting lip, said retainer located within said enclosure bottom section so that the carrier in the closed mode compresses the device rigid body between said holding pedestal and said retainer supporting lip by spring action between said enclosure top and bottom sections.

13. A carrier as claimed in claim 12 wherein:
   (a) said enclosure bottom section additionally includes a floor; and
   (b) said integrated circuit retainer additionally includes:
      (1) an integrated circuit retaining pedestal having a base and a platform, the base being attached to the interior of said floor, said retaining pedestal extending toward the interior of said enclosure bottom section and terminating in the pedestal platform, and
      (2) an integrated circuit anchoring wall having first and second edges, said anchoring wall first edge being attached to said retaining pedestal platform, said anchoring wall extending toward said floor, and said retained supporting lip being attached to said anchoring wall second edge and being substantially parallel to said floor.

14. A carrier as claimed in claim 9 wherein the device rigid body has information thereon, and wherein the carrier additionally comprises means, integral with said bottom section, for displaying the device rigid body so that information on the rigid body is observable from outside the carrier.

15. A carrier as claimed in claim 9 additionally comprising means, integral with the exterior of said top and bottom sections, for aiding the stackability of the carrier by providing structure which mates with corresponding aiding means of other of said bottom and top sections respectively.

16. A method for protecting an integrated circuit having a rigid body with information printed thereon and having conductive leads, said method comprising the steps of:
   (a) enclosing the integrated circuit within an antistatic enclosure having opposing sections, said enclosing step to protect the integrated circuit from static discharges;
   (b) clamping the integrated circuit in a stationary position between and in contact with the opposing sections of said enclosing step to protect the conductive leads from mechanical deformation;

(c) supporting the integrated circuit in said retaining step by the rigid body so that the conductive leads remain unsupported by the enclosure, said supporting step for protecting the conductive leads from contamination.

17. The method for protecting as claimed in claim 16 wherein said enclosing step additionally comprises the step of displaying the integrated circuit rigid body outside the enclosure so that the rigid body information can be viewed without disturbing the integrated circuit.

18. A carrier, having a closed mode, for housing a flat pack integrated circuit having conductive leads attached to a rigid body, the rigid body having information thereon, said carrier comprising:

(a) an antistatic enclosure having a top section and having a bottom section, said enclosure bottom section having a floor;

(b) an antistatic, living hinge connecting said enclosure top and bottom sections together so that said hinge and said enclosure top and bottom sections form integral portions of a one-piece object;

(c) a holding pedestal centrally located within said enclosure top section;

(d) an integrated circuit retaining pedestal having a base and a platform, the base being attached to the central interior of said floor, said retaining pedestal extending toward the interior of said enclosure and terminating in the pedestal platform;

(e) an integrated circuit anchoring wall having first and second edges, said anchoring wall first edge being attached to said retaining pedestal platform, and said anchoring wall perpendicularly extending toward said floor;

(f) a supporting lip attached to said anchoring wall second edge, said supporting lip being substantially parallel to said floor so that said enclosure in the closed mode compresses the integrated circuit rigid body between said holding pedestal and said supporting lip by spring action of said enclosure;

(g) means for latching said enclosure top and bottom sections together; and (h) means, integral with said supporting lip, for displaying the integrated circuit rigid body so that information printed thereon is observable from outside said enclosure.

* * * * *